(12) United States Patent
Milgrome et al.

(10) Patent No.: US 11,784,462 B2
(45) Date of Patent: Oct. 10, 2023

(54) APPARATUS AND METHODS FOR SAFE PULSED LASER OPERATION

(71) Applicant: VELODYNE LIDAR USA, INC., San Jose, CA (US)

(72) Inventors: Oren Milgrome, Richmond, CA (US); Tyler Banas, Alameda, CA (US); Phillip Edwards, San Jose, CA (US)

(73) Assignee: Velodyne Lidar USA, Inc., San Jose, CA (US)

( * ) Notice: Subject to any disclaimer, the term of this patent is extended or adjusted under 35 U.S.C. 154(b) by 411 days.

(21) Appl. No.: 16/988,420

(22) Filed: Aug. 7, 2020

(65) Prior Publication Data

US 2021/0041567 A1 Feb. 11, 2021

Related U.S. Application Data

(60) Provisional application No. 62/884,102, filed on Aug. 7, 2019.

(51) Int. Cl.
*H01S 5/068* (2006.01)
*G01S 7/484* (2006.01)

(52) U.S. Cl.
CPC .......... *H01S 5/06808* (2013.01); *G01S 7/484* (2013.01); *H01S 5/06825* (2013.01)

(58) Field of Classification Search
CPC .............................. G01S 7/484; H01S 5/06825
USPC ...................................................... 372/38.07
See application file for complete search history.

(56) References Cited

U.S. PATENT DOCUMENTS

| | | | |
|---|---|---|---|
| 11,043,102 B1* | 6/2021 | Yanamadala | H04L 9/004 |
| 2014/0226147 A1* | 8/2014 | Metzler | H03K 3/57 356/5.01 |
| 2016/0204623 A1* | 7/2016 | Haggerty | H02J 7/00716 320/162 |
| 2017/0070029 A1 | 3/2017 | Moeneclaey et al. | |
| 2018/0188360 A1 | 7/2018 | Berger et al. | |
| 2018/0267152 A1 | 9/2018 | McMichael et al. | |

OTHER PUBLICATIONS

International Search Report and Written Opinion, PCT/US2020/045495, dated Oct. 13, 2020, pp. 1-20.
Communication Pursuant to Rules 161(1) and 162 EPC in Corresponding EP Application No. 20761051.0-1206, dated Feb. 15, 2022.

* cited by examiner

*Primary Examiner* — Tuan N Nguyen
(74) *Attorney, Agent, or Firm* — Kilpatrick Townsend & Stockton LLP

(57) ABSTRACT

An apparatus may include an energy rate limiter, an electro-optical transmitter, and an energy monitor. The energy rate limiter limits energy transfer, based on an energy control signal, from a power supply to the energy storage module. The energy storage module is charged based on the energy transfer from the power supply. The electro-optical transmitter includes lasers coupled to local energy storage module. Laser firings of the lasers are based on an electrical potential of the energy storage module and laser enable signals corresponding to the lasers. The energy monitor is coupled to the energy storage module and triggers a safety alarm signal if a voltage provided by the energy storage module violates a safety condition related to a threshold voltage. The energy rate limiter terminates the energy transfer from the power supply to the local energy storage module after the safety condition is violated.

29 Claims, 8 Drawing Sheets

*For LiDAR, the emitted light source 110 is a laser*

Single emitter/detector pair oscillating mirror LIDAR design.

APPARATUS AND METHODS FOR SAFE PULSED LASER OPERATION

CROSS-REFERENCE TO RELATED APPLICATION(S)

This application claims priority to and benefit of U.S. Provisional Patent Application Ser. No. 62/884,102, titled "Apparatus and Methods for Optical Power Control for Eye Safe Pulsed Laser Operation" and filed on Aug. 7, 2019, which is hereby incorporated by reference herein in its entirety.

FIELD OF TECHNOLOGY

The present disclosure relates generally to apparatus and methods for protecting health during pulse laser operation and more particularly to apparatus and methods that can improve eye safety during expected and unexpected operating conditions of an optical system such as a LiDAR (light detection and ranging) system.

BACKGROUND

Light detection and ranging ("LiDAR") systems measure the attributes of their surrounding environments (e.g., shape of a target, contour of a target, distance to a target, etc.) by illuminating the target with pulsed laser light and measuring the reflected pulses with a sensor. Differences in laser return times and wavelengths can then be used to make digital 3-D representations of a surrounding environment. LiDAR technology may be used in various applications including autonomous vehicles, advanced driver assistance systems, mapping, security, surveying, robotics, geology and soil science, agriculture, and unmanned aerial vehicles, etc. Depending on the application and associated field of view, multiple channel or laser beams may be used to produce images in a desired resolution. A LiDAR system with greater numbers of channels can generate larger numbers of pixels.

In a multi-channel LiDAR device, optical transmitters are paired with optical receivers to form multiple "channels." In operation, each channel's transmitter emits an optical signal (e.g., laser) into the device's environment and detects the portion of the signal that is reflected back to the channel's receiver by the surrounding environment. In this way, each channel provides "point" measurements of the environment, which can be aggregated with the point measurements provided by the other channels to form a "point cloud" of measurements of the environment.

The measurements collected by a LiDAR channel may be used to determine the distance ("range") from the device to the surface in the environment that reflected the channel's transmitted optical signal back to the channel's receiver, as well as the reflectance of that surface. The range to a surface may be determined based on the time of flight of the channel's signal (e.g., the time elapsed from the transmitter's emission of the optical signal to the receiver's reception of the return signal reflected by the surface). The reflectance of a surface may be determined based on the intensity on the return signal, which generally depends not only on the reflectance of the surface but also on the range to the surface, the emitted signal's glancing angle with respect to the surface, the power level of the channel's transmitter, the alignment of the channel's transmitter and receiver, and other factors.

"Laser safety" generally refers to the safe design, use and implementation of lasers to reduce the risk of laser accidents, especially those involving eye injuries. "Laser" is an acronym which stands for Light Amplification by Stimulated Emission of Radiation. The energy generated by the laser is in or near the optical portion of the electromagnetic spectrum. Even relatively small amounts of laser light can lead to permanent eye injuries. Moderate and high-power lasers are potentially hazardous because they can burn the retina or cornea of the eye, or even the skin. The coherence and low divergence angle of laser light, aided by focusing from the lens of an eye, can cause laser radiation to be concentrated into an extremely small spot on the retina. Sufficiently powerful lasers in the visible to near infrared range (400-1400 nm) can penetrate the eyeball and may cause heating of the retina. In some embodiments, a LiDAR system may operate at a wavelength of 905 nm.

SUMMARY

According to an aspect of the present disclosure, an apparatus may include an energy rate limiter, an electro-optical transmitter, and an energy monitor. The energy rate limiter limits energy transfer, based on an energy control signal, from a power supply to the energy storage module. The energy storage module is charged based on the energy transfer from the power supply. The electro-optical transmitter includes lasers coupled to local energy storage module. Laser firings of the lasers are based on an electrical potential of the energy storage module and laser enable signals corresponding to the lasers. The energy monitor is coupled to the energy storage module and triggers a safety alarm signal if a voltage provided by the energy storage module violates a safety condition related to a threshold voltage. The energy rate limiter terminates the energy transfer from the power supply to the local energy storage module after the safety condition is violated.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of any of the present inventions. As can be appreciated from foregoing and following description, each and every feature described herein, and each and every combination of two or more such features, is included within the scope of the present disclosure provided that the features included in such a combination are not mutually inconsistent. In addition, any feature or combination of features may be specifically excluded from any embodiment of any of the present inventions.

The foregoing Summary is intended to assist the reader in understanding the present disclosure, and does not in any way limit the scope of any of the claims.

BRIEF DESCRIPTION OF THE DRAWINGS

The accompanying figures, which are included as part of the present specification, illustrate the presently preferred embodiments and together with the generally description given above and the detailed description of the preferred embodiments given below serve to explain and teach the principles described herein.

Figure 1:
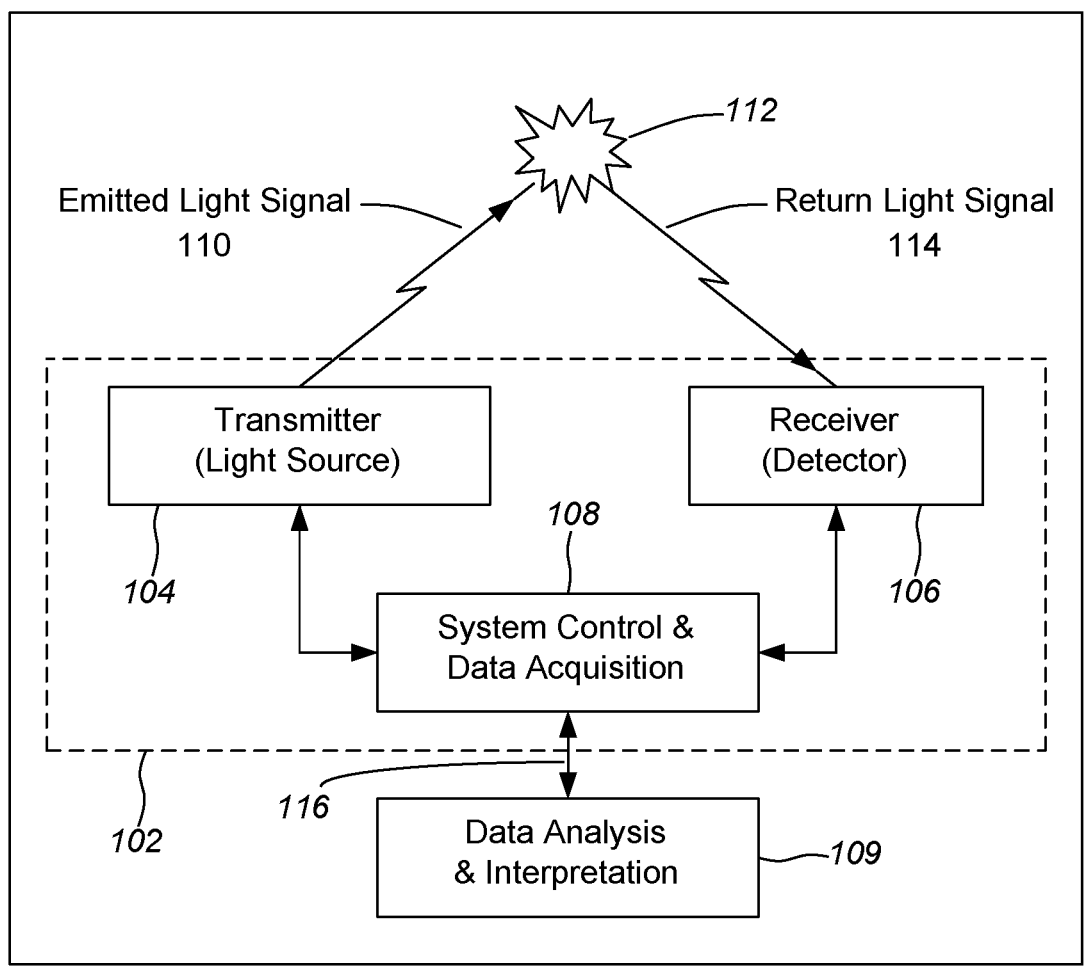
FIG. 1 is an illustration of the operation of an example of a LiDAR system.

While the present disclosure is subject to various modifications and alternative forms, specific embodiments thereof have been shown by way of example in the drawings and will herein be described in detail. The present disclosure should be understood to not be limited to the particular forms disclosed, but on the contrary, the intention is to cover all modifications, equivalents, and alternatives falling within the spirit and scope of the present disclosure.

DETAILED DESCRIPTION

Apparatus and methods for safe operation of pulsed laser devices are disclosed. It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details.

Terminology

Measurements, sizes, amounts, etc. may be presented herein in a range format. The description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as 10-20 inches should be considered to have specifically disclosed subranges such as 10-11 inches, 10-12 inches, 10-13 inches, 10-14 inches, 11-12 inches, 11-13 inches, etc.

Furthermore, connections between components or systems within the figures are not intended to be limited to direct connections. Rather, data or signals between these components may be modified, re-formatted, or otherwise changed by intermediary components. Also, additional or fewer connections may be used. The terms "coupled," "connected," or "communicatively coupled" shall be understood to include direct connections, indirect connections through one or more intermediary devices, and wireless connections.

Reference in the specification to "one embodiment," "preferred embodiment," "an embodiment," "some embodiments," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

Furthermore, one skilled in the art shall recognize that: (1) certain steps may optionally be performed; (2) steps may not be limited to the specific order set forth herein; (3) certain steps may be performed in different orders; and (4) certain steps may be performed concurrently.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

Motivation for and Benefits of Some Embodiments

In environments where lasers operate, the safety of the tissues and organs of living organisms (e.g., eye safety and/or skin safety in humans) depends on laser operating parameters. These operating parameters may include, without limitation, the wavelength of the laser beam, the optical power of the laser beam, the tissue or organ's duration of exposure to the laser beam, etc. Limits on these operating parameters can affect a laser's performance and/or design characteristics (e.g., firing speed, density, range).

Accordingly, what is needed are laser devices that meet regulated eye safety standards under expected and unexpected operating conditions, while also providing acceptable performance under expected operating conditions. In some cases, a laser device's optical energy emission may be higher during unexpected operating conditions, such as a fault condition, than during normal, expected (e.g., fault-free) operation. Some embodiments of the apparatus and methods described herein facilitate high (e.g., maximal) optical energy emission during expected operating conditions while simultaneously limiting (e.g., minimizing) optical energy emission during unexpected operating conditions.

LiDAR Systems

A light detection and ranging ("LiDAR") system, may be used to measure the shape and contour of the environment surrounding the system. LiDAR systems may be applied to numerous applications including autonomous navigation and aerial mapping of surfaces. In general, a LiDAR system emits light pulses that are subsequently reflected by objects within the environment in which the system operates. The time each pulse travels from being emitted to being received (i.e., time-of-flight, "TOF") may be measured to determine the distance between the LiDAR system and the object that reflects the pulse. The science of LiDAR systems is based on the physics of light and optics.

In a LiDAR system, light may be emitted from a rapidly firing laser. Laser light travels through a medium and reflects off points of surfaces in the environment (e.g., surfaces of buildings, tree branches, vehicles, etc.). The reflected light energy returns to a LiDAR detector where it may be recorded and used to map the environment.

FIG. 1 depicts the operation of a LiDAR system 100, according to some embodiments. In the example of FIG. 1, the LiDAR system 100 includes a LiDAR device 102, which may include a transmitter 104 that transmits an emitted light signal 110, a receiver 106 comprising a detector, and a control and data acquisition module 108. The LiDAR device 102 may be referred to as a LiDAR transceiver. In operation, the emitted light signal 110 propagates through a medium and reflects off an object 112, whereby a return light signal 114 propagates through the medium and is received by receiver 106.

The control and data acquisition module 108 may control the light emission by the transmitter 104 and may record data derived from the return light signal 114 detected by the receiver 106. In some embodiments, the control and data acquisition module 108 controls the power level at which the transmitter operates when emitting light. For example, the transmitter 104 may be configured to operate at a plurality of different power levels, and the control and data acquisition module 108 may select the power level at which the transmitter 104 operates at any given time. Any suitable technique may be used to control the power level at which the transmitter 104 operates. In some embodiments, the control and data acquisition module 108 determines (e.g., measures) characteristics of the return light signal 114 detected by the receiver 106. For example, the control and data acquisition module 108 may measure the intensity of the return light signal 114 using any suitable technique.

A LiDAR transceiver may include one or more optical lenses and/or mirrors (not shown). The transmitter 104 may emit a laser beam having a plurality of pulses in a particular sequence. Design elements of the receiver 106 may include its horizontal field of view (hereinafter, "FOV") and its vertical FOV. One skilled in the art will recognize that the FOV parameters effectively define the visibility area relating to the specific LiDAR transceiver. More generally, the horizontal and vertical FOVs of a LiDAR system may be defined by a single LiDAR device (e.g., sensor) or may relate to a plurality of configurable sensors (which may be exclusively LiDAR sensors or may have different types of sensors). The FOV may be considered a scanning area for a LiDAR system. A scanning mirror or rotating assembly may be utilized to obtain a scanned FOV.

The LiDAR system may also include a data analysis & interpretation module 109, which may receive an output via connection 116 from the control and data acquisition module 108 and perform data analysis functions. The connection 116 may be implemented using a wireless or non-contact communication technique.

Figure 2A:
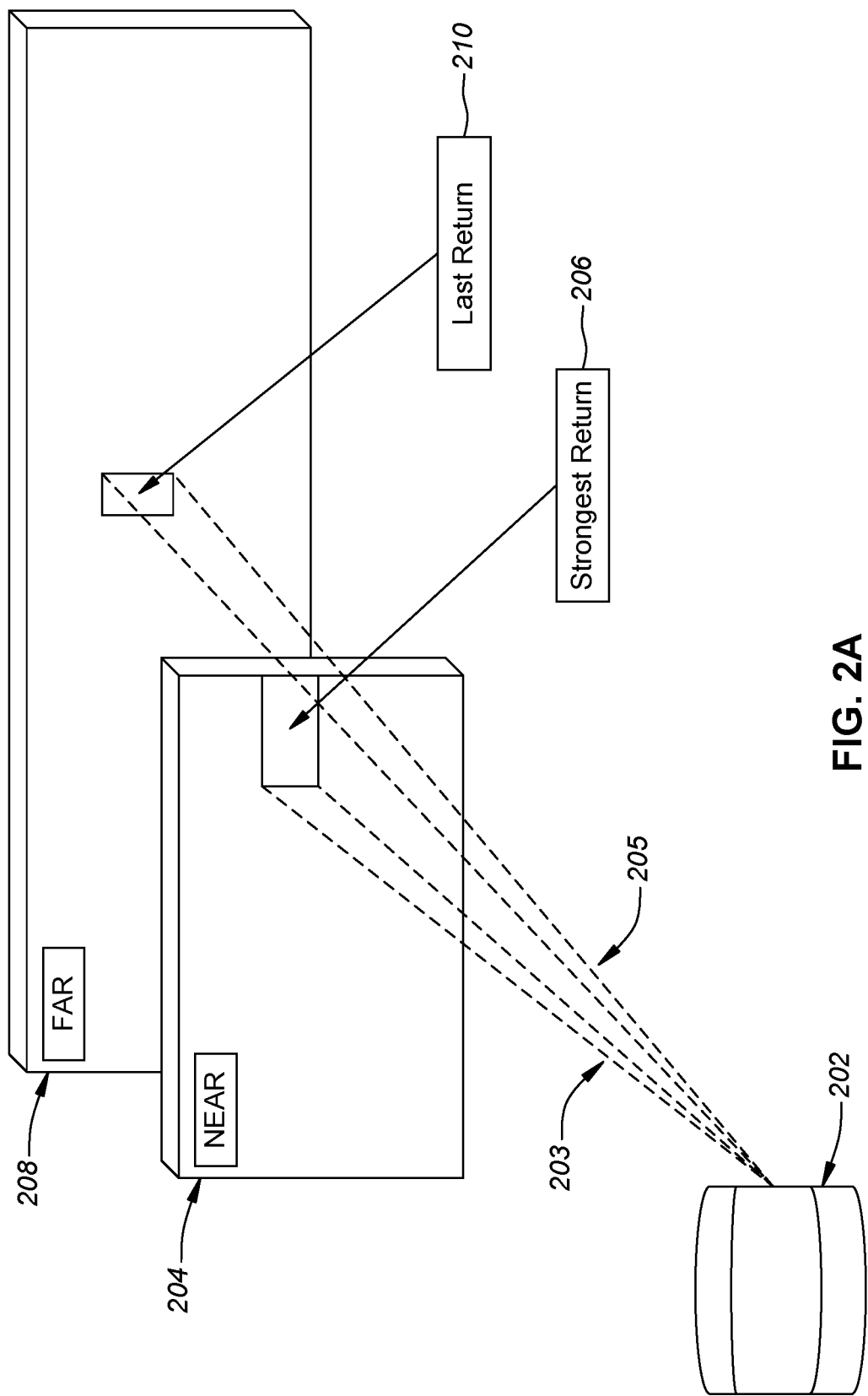
FIG. 2A is another illustration of the operation of an example of a LiDAR system.

FIG. 2A illustrates the operation of a LiDAR system 202, in accordance with some embodiments. In the example of FIG. 2A, two return light signals 203 and 205 are shown. Laser beams generally tend to diverge as they travel through a medium. Due to the laser's beam divergence, a single laser emission often hits multiple objects producing multiple return signals. The LiDAR system 202 may analyze multiple return signals and report one of the return signals (e.g., the strongest return signal, the last return signal, etc.) or more than one (e.g., all) of the return signals. In the example of FIG. 2A, LiDAR system 202 emits a laser in the direction of near wall 204 and far wall 208. As illustrated, the majority of the beam hits the near wall 204 at area 206 resulting in return signal 203, and another portion of the beam hits the far wall 208 at area 210 resulting in return signal 205. Return signal 203 may have a shorter TOF and a stronger received signal strength compared with return signal 205. In both single and multiple return LiDAR systems, it is important that each return signal is accurately associated with the transmitted light signal so that an accurate TOF is calculated.

Some embodiments of a LiDAR system may capture distance data in a two-dimensional ("2D") (e.g., single plane) point cloud manner. These LiDAR systems may be used in industrial applications, or may be repurposed for surveying, mapping, autonomous navigation, and other uses. Some embodiments of these systems rely on the use of a single laser emitter/detector pair combined with a moving mirror to effect scanning across at least one plane. This mirror may reflect the emitted light from the transmitter (e.g., diode), and/or may reflect the return light to the receiver (e.g., detector). Use of an oscillating mirror in this manner may enable the LiDAR system to achieve 90-180-360 degrees of azimuth (horizontal) view while simplifying both the system design and manufacturability. Many applications require more data than just a single 2D plane. The 2D point cloud may be expanded to form a three-dimensional ("3D") point cloud, where multiple 2D clouds are used, each pointing at a different elevation (vertical) angle. Design elements of the receiver of the LiDAR system 202 may include the horizontal FOV and the vertical FOV.

Figure 2B:
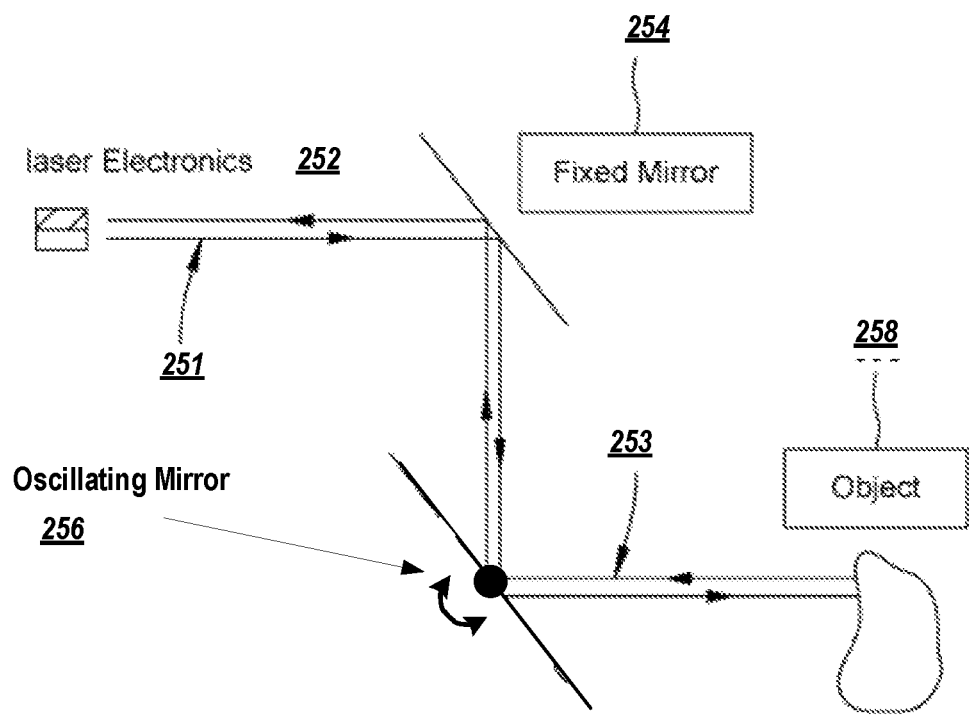
FIG. 2B is an illustration of an example of a LiDAR system with an oscillating mirror.

FIG. 2B depicts a LiDAR system 250 with an oscillating mirror, according to some embodiments. In the example of FIG. 2B, the LiDAR system 250 uses a single laser emitter/detector pair combined with an oscillating mirror 256 to effectively scan across a plane. Distance measurements obtained by such a system may be effectively two-dimensional (e.g., planar), and the captured distance points may be rendered as a 2D (e.g., single plane) point cloud. In some embodiments, but without limitation, the oscillating mirror 256 may oscillate at very fast speeds (e.g., thousands of cycles per minute).

The LiDAR system 250 may have laser electronics 252, which may include a single light emitter and light detector. The emitted laser signal 251 may be directed to a fixed mirror 254, which may reflect the emitted laser signal 251 to the oscillating mirror 256. As oscillating mirror 256 "oscillates," the emitted laser signal 251 may reflect off an object 258 in its propagation path. The reflected signal 253 may be coupled to the detector in laser electronics 252 via the oscillating mirror 256 and the fixed mirror 254. Design elements of the receiver of LiDAR system 250 include the horizontal FOV and the vertical FOV, which defines a scanning area.

Eye Safety in Laser Environments

A great concern of those working with or around laser beams is eye injury. The extent of eye damage caused by exposure to a laser beam depends on the part of the eye that is exposed and the exposure parameters (e.g., wavelength of the laser beam, power or pulse energy of the laser beam, duration of exposure, etc.). These factors are used to determine the Maximum Permissible Exposure, or MPE. The MPE is the biological limit for safety. It can be considered the level of laser radiation to which a person may be exposed without adverse biological changes in the eye or skin.

Laser safety encompasses the safe design, use and implementation of lasers to reduce (e.g., minimize) the risk of laser accidents, especially those involving eye injuries. Lasers are potentially hazardous because they can burn the retina of the eye, or even the skin. Accordingly, the sale and operation of laser devices is strictly regulated by government regulations, for example 21 Code of Federal Regulations (CFR) Part 1040 in the US and International Standard IEC 60825. These regulations define laser classifications based on their power and wavelength and longest reasonably foreseeable exposure duration. More specifically, the objectives of IEC 60825 include 1) the classification of lasers and laser devices emitting radiation in the wavelength range 180 nm to 1 mm according to the degree of optical radiation hazard they pose, to aid hazard evaluation and the determination of user control measures; 2) the establishment of requirements for laser device manufacturers to supply information so that proper precautions can be adopted; 3) the provision of adequate warning to individuals of laser device hazards through labels and instructions; and 4) a reduction of the possibility of injury by reducing (e.g., minimizing) unnecessary accessible radiation and providing improved control of the laser radiation hazards through protective features associated with accessible radiation from laser devices.

A laser device may be classified on the basis of the combination of output power(s) and wavelength(s) of the accessible emission (laser radiation) over the full range of capability during operation at any time after manufacture which results in its allocation to the highest appropriate class. Such evaluation may include consideration of any reasonably foreseeable single-fault condition during operation. A laser device may be assigned to a particular class when it has met all of the requirements within the class, for example, engineering controls, labelling requirements, and the provision of relevant information to the user.

Each laser utilized in a LiDAR system may generally be referred to as a "laser pointer" and classed as Class FDA Ma or Class IEC 3R. In these classes, a laser pointer, depending on power and beam area, can be momentarily hazardous when directly viewed or when staring directly at the beam with an unaided eye. Risk of injury can increase when viewed with optical aids.

IEC 60825 also includes consideration for repetitive pulsed lasers as used in LiDAR systems. The exposure from any group of pulses (or sub-group of pulses in a train) delivered in any given time should not exceed a maximum permissible exposure (MPE) specification. There are specific MPE regulations in IEC 60825 for ocular exposure for wavelengths less than 400 nm and longer than 1400 nm, as well as the MPE for skin exposure. Additionally, there are different specific MPE regulations included in IEC 60825 for ocular exposure for wavelengths 400 nm to 1400 nm, including retinal thermal limits.

Relative to the pulse width, the eye may absorb more light energy with a shorter pulse width, but a longer pulse width can cause more heat. Overall, the energy level increases as the pulse width increases. The FDA and IEC specify the joules per second a laser pointer (e.g. a LiDAR transmitter) may transmit when firing continuously.

Laser light absorption and some of its effect on various parts of the eye are wavelength dependent. For example, wavelengths in the ultraviolet range (approximately 180 to 400 nanometers) can cause damage to the cornea and lens but generally do not penetrate to the retina. Visible-light (approximately 400 to 700 nanometers) is transmitted and focused by the cornea and lens onto the retina. Light in the near-infrared range (approximately 700 to 1400 nanometers) also reaches the retina with the potential to cause lesions. Finally, light in the mid- and far-infrared ranges (approximately 1400 nanometers to one million nanometers or 1 millimeter) is absorbed by the cornea and lens and converted to heat, which can cause damage.

In some embodiments, the lasers of LiDAR systems operate in the near-infrared range, e.g., approximately 905 nm wavelength. Because this wavelength is close to the wavelength of visible light (red light starts around 780 nm), excessive near-infrared range laser light can cause human eye damage to the sensitive light detectors of their retinas. For this reason, the power level of 905 nm lasers in the U.S. and other jurisdictions is strictly regulated by government regulations as previously discussed.

In some other embodiments, the lasers of LiDAR systems may operate at approximately 1550 nm, outside the visible light range. The eye's interior is transparent to 905 nm light, so LiDAR systems at that wavelength can reach the vulnerable retina. The eye is opaque to 1550 nm light so that wavelength cannot reach the retina, allowing the use of higher power LiDAR without endangering the retina. However, as noted above, the generation of heat in the cornea and lens may present a safety consideration.

There are generally tradeoffs between the safety of a laser (in practice or as defined by applicable government regulations) and the flexibility of the laser. Key factors may include 1) the laser's firing speed (e.g., the laser beam's pulse rate, frequency of transmission, etc.); 2) the density of the laser device design (e.g., physical density, channel spacing, spot diameter, optical power density, etc.); and 3) the transmission range of the laser. These factors may have added complexity with multiple LiDAR systems.

Transmitter Optical Sub-Assembly (TOSA)

It is desirable for laser devices to operate such that they can meet regulated eye safety standards under expected and unexpected operating conditions. In some cases, a laser device's optical energy emission may be higher during unexpected operating conditions, such as a fault condition, than during normal, expected (e.g., fault-free) operation. Some embodiments of the apparatus and methods described herein facilitate high (e.g., maximal) optical energy emission during expected operating conditions while simultaneously limiting (e.g., minimizing) optical energy emission during unexpected operating conditions.

According to an aspect of the present disclosure, the amount of energy that can be supplied to a laser diode under one or more single point failure criteria is precisely limited. "Single point failure criteria" refer to fault conditions in which there is one fault at a time. Such criteria may be defined by applicable regulations and/or standards (e.g., FDA, IEC).

The ratio of the optical energy emitted by a laser diode to the electrical energy dissipated by the laser diode is the electro-optical efficiency of the laser diode. The electro-optical efficiency of the laser diode can be determined by simultaneous optical and electrical energy measurements. Within experimental statistical limits: 1) the electro-optical efficiency of a laser diode may be constant or decreasing over the operating lifetime of the laser diode; and 2) the electro-optical efficiency of the laser diode does not increase during the lifetime of the laser diode. Therefore, after validation of the electro-optical efficiency $E_0$ at initial start of laser diode operation, the maximal optical energy emission of the laser diode during its operational lifetime can be estimated based on measurement of the laser diode's electrical energy dissipation and the laser diode's initial electro-optical efficiency $E_0$, without simultaneous optical energy measurement. Likewise, after validation of the electro-optical efficiency $E_P$ of laser diode operation at any time $t_P$, the maximal optical energy emission during the remainder of laser diode's operational lifetime ($t > t_P$) can be estimated based on measurement of the laser diode's electrical energy dissipation and the laser diode's prior electro-optical efficiency $E_P$, without simultaneous optical energy measurement.

Figure 3:
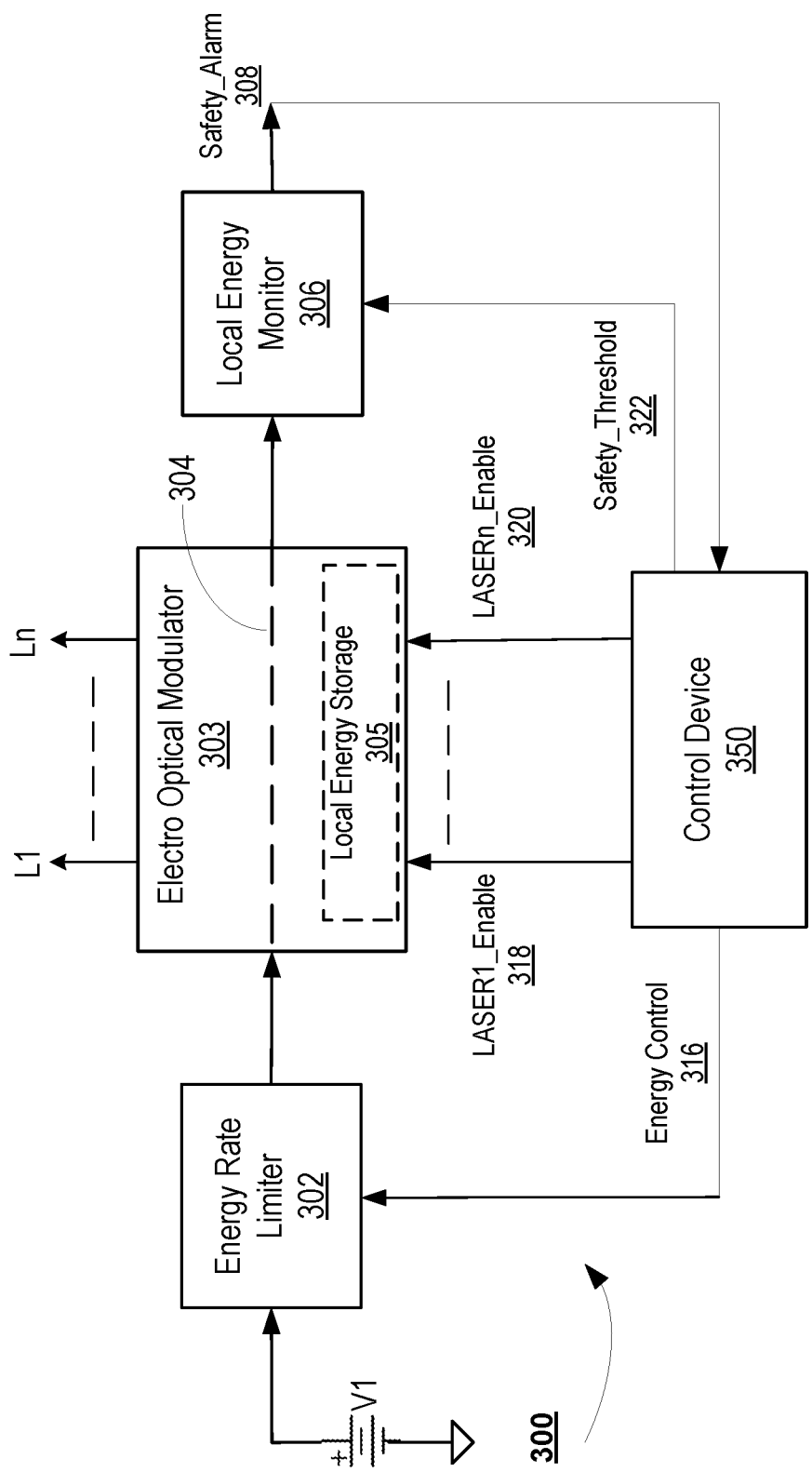
FIG. 3 is a block diagram of a transmitter optical sub-assembly (TOSA) according to some embodiments.

FIG. 3 depicts functional blocks of a transmitter optical sub-assembly (TOSA) 300 according to some embodiments. In the example of FIG. 3, TOSA 300 includes energy rate limiter 302, electro optical modulator 303, and local energy monitor 306. The electro optical modulator 303 may further include local energy storage 305. In some embodiments, TOSA 300 allows one or more laser diodes to operate safely within a defined safety threshold.

In the example of FIG. 1, power supply V1 is configured to provide electrical energy to one or more components of the TOSA 300 via the energy rate limiter 302. In particular, power supply V1 may be configured to provide electrical energy to the internal node 304 of the electro optical modulator 303. Electrical energy provided to the internal node 304 may be used to charge the energy storage components of the local energy storage 305. The power supply V1 may be internal or external to the TOSA 300. Any suitable type of power supply V1 may be used.

The energy rate limiter 302 may control (e.g., limit) the rate of electrical energy transfer from the power supply V1 (e.g., from the positive terminal of power supply V1) to one or more components of the TOSA 300 (e.g., to internal node 304 of the electro optical modulator 303). In this way, the energy rate limiter 302 may control the charging of the energy storage components (e.g., capacitors, inductors, batteries, etc.) of the local energy storage 305. In some cases, the energy rate limiter 302 transfers electrical energy from the power supply V1 to the internal node 304 at an appropriate rate and for an appropriate duration to charge the energy storage components of the local energy storage 305 to the power supply voltage V1 or to any other suitable voltage.

The operation of the energy rate limiter 302 may be controlled by an energy control signal 316. Based on the energy control signal 316, the energy rate limiter 302 may operate in a "connected state" or in a "disconnected state." In the "disconnected state," the energy rate limiter 302 may disconnect the power supply V1 from the electro optical modulator 303, such that no electrical energy is transferred from the power supply V1 to the electro optical modulator 303 via the energy rate limiter 302. In the "connected state," the energy rate limiter 302 may connect the power supply V1 to the electro optical modulator 303, such that electrical energy is transferred from the power supply V1 to the electro optical modulator 303 via the energy rate limiter 302. In some embodiments, the energy rate limiter 302 operates in the connected state based on (e.g., in response to) the energy control signal 316 having a particular value (e.g., a voltage greater than a particular threshold value TV1, or a voltage less than a particular threshold value TV2). Likewise, in some embodiments, the energy rate limiter 302 operates in the disconnected state based on (e.g., in response to) the energy control signal 316 having a particular value (e.g., a voltage less than a particular threshold value TV1, or a voltage greater than a particular threshold value TV2).

When the energy rate limiter 302 is in the connected state, the amount or rate of energy transferred from the power supply V1 to the electro optical modulator 303 through the energy rate limiter 302 may vary based on the energy control signal 316. For example, the amount or rate of energy transferred through the energy rate limiter 302 may be a function of the voltage of the power supply V1, the voltage of the energy control signal 316, and a threshold voltage TV.

The electro optical modulator 303 may have one or more lasers (e.g., 'n' lasers). Any suitable number of lasers may be used, for example, 1-64 lasers, 8 lasers, etc. In some embodiments, each of the lasers is implemented using a laser diode. In some embodiments, each of the laser control signals (318-320) enables current to pass through a corresponding laser diode, thereby causing the electro optical modulator to transmit a corresponding laser signal (L1 through Ln). Likewise, in some embodiments, each of the laser control signals 318-320 may prevent current from passing through a corresponding laser diode, thereby causing the electro optical modulator to terminate the transmission of a corresponding laser signal (L1 through Ln).

In some embodiments, the local energy monitor 306 monitors the voltage of internal node 304 and compares the monitored voltage with an input, safety threshold signal 322, to generate an output, safety alarm signal 308. Monitoring the voltage of internal node 304 may involve measuring the voltage of internal node 304. The monitoring and/or the comparing may be performed continuously, continually, periodically, intermittently, or in response to control signals. In some embodiments, local energy monitor 306 asserts (e.g., enables) the safety alarm signal 308 in response to determining that the voltage of the internal node 304 violates a safety condition. The safety condition may relate to the relationship between the voltage of the internal node 304 and a safety threshold voltage. For example, the safety condition may be violated if the voltage of the internal node 304 exceeds the safety threshold voltage 322, or if the voltage of the internal node 304 is below the safety threshold 322. After being asserted, the safety alarm signal 308 may remain asserted until any suitable safety criteria are met (e.g., until a reset signal is received, until the voltage of internal node satisfies the safety condition, etc.).

In some embodiments, the local energy monitor 306 provides the safety alarm signal 308 to the energy rate limiter 302 as the energy control signal 316. In some embodiments, the energy control signal 316 is generated (e.g., asserted and/or de-asserted) based on the Safety Alarm signal 308. Optionally, the energy control signal 316 may also be generated based on one or more other signals. The energy control signal 316 may be generated by any suitable component, including (without limitation) the local energy monitor 306, another component of the TOSA 300, or a control device 350 (e.g., a programmable processing device or digital logic circuit) external to the TOSA 300. In some embodiments, the component that generates the energy control signal 316 may assert (e.g., enable) the energy control signal 316 when the safety alarm signal 308 (and, optionally, one or more other signals) indicates that one or more conditions for safely energizing (e.g., charging) the local energy storage 305 are met (e.g., when no set of single point failure criteria are met). In some embodiments, the component that generates the energy control signal 316 may de-assert (e.g., disable) the energy control signal 316 when the safety alarm signal 308 (and, optionally, one or more other signals) indicates that one or more conditions for safely energizing the local energy storage 305 are not met (e.g., when a set of single point failure criteria are met). Likewise, in some embodiments, the component that generates the laser control signals (e.g., signals 318-320) may de-assert the laser control signals when the safety alarm signal 308 (and, optionally, one or more other signals) indicates that one or more conditions for safely operating the lasers are not met. When the energy control signal 316 is de-asserted (disabled), the energy rate limiter 302 may change from the connected state to the disconnected state to prevent the energy rate limiter 302 from providing additional energy from the power supply V1 to the local energy storage 305.

In some embodiments, internal node 304 may be coupled (e.g., conductively coupled, directly connected, etc.) to an output of the Energy Rate Limiter 302 and to an input of local energy monitor 306 through the electro optical modulator 303. In some embodiments, terminals (e.g., anodes) of the electro optical modulator's laser diodes are also coupled to internal node 304.

Still referring to FIG. 3, during expected operation of the laser diodes of the electro optical modulator 303, the electrical energy dissipation and hence optical energy emission of each laser diode may be determined by the amount and duration of current flow through the laser diode, which may be controlled by (1) the corresponding laser control signal (318-320), and (2) the voltage at the laser diode's terminal (e.g., the voltage at the laser diode's anode, which is the voltage of internal node 304). The optical pulse duration of a laser pulse emitted by a laser diode may be determined by the duration of current flow through the laser diode. The optical pulse power may be determined based on the optical pulse duration and the magnitude of the current through the laser diode during the optical pulse, which depends on the voltage at the laser diode's terminal (e.g., anode) (e.g., the voltage of internal node 304) during the optical pulse and internal circuitry of the electro optical modulator 303.

During unexpected operation of the laser diodes, the internal circuitry of the local energy monitor 306 or laser control signals 318-320 may fail. Likewise, the internal circuitry of the energy rate limiter 302 or electro optical modulator 303 may fail. However, the TOSA 300 may limit the optical energy emitted by the electro optical modulator 303 when a single component fails. More specifically, local energy storage 305 may limit the amount of energy that is provided to the lasers of the electro optical modulator 303 in the event of such a failure. That is, if there is a failure in TOSA 300, the voltage of internal node 304 may violate one or more safety conditions (e.g., may rise above a safety threshold), causing the safety alarm signal 308 to be asserted (enabled). In response to the safety alarm signal 308 being asserted, the energy control signal 316 may be de-asserted, which causes the energy rate limiter 302 to limit the transfer of energy from the power supply V1 to the local energy storage 305. In some embodiments, the amount of energy transferred from the power supply V1 to the local energy storage 305 when the energy control signal 316 is de-asserted is less than or equal to a threshold amount (e.g., 0 kWh or 10 µJ). In some embodiments, the rate at which energy is transferred from the power supply V1 to the local energy storage 305 when the energy control signal 316 is de-asserted is less than or equal to a threshold rate (e.g., 0 W). Hence, after the energy control signal 316 is de-asserted, the operation (firing) of the lasers may be limited to the remaining energy stored in the local energy storage 305. The capacities of the energy storage components in the local energy storage 305 may be selected such that the remaining energy may be consumed after a few (e.g., 1-10) laser firings, even if the energy storage components are fully charged when the energy control signal 316 is de-asserted. After the safety alarm signal is asserted, the TOSA 300 or the controller 350 may prohibit assertion of the energy control signal 316 until specified conditions are met (e.g., the TOSA is power-cycled, service procedures are performed, etc.).

Figure 4:
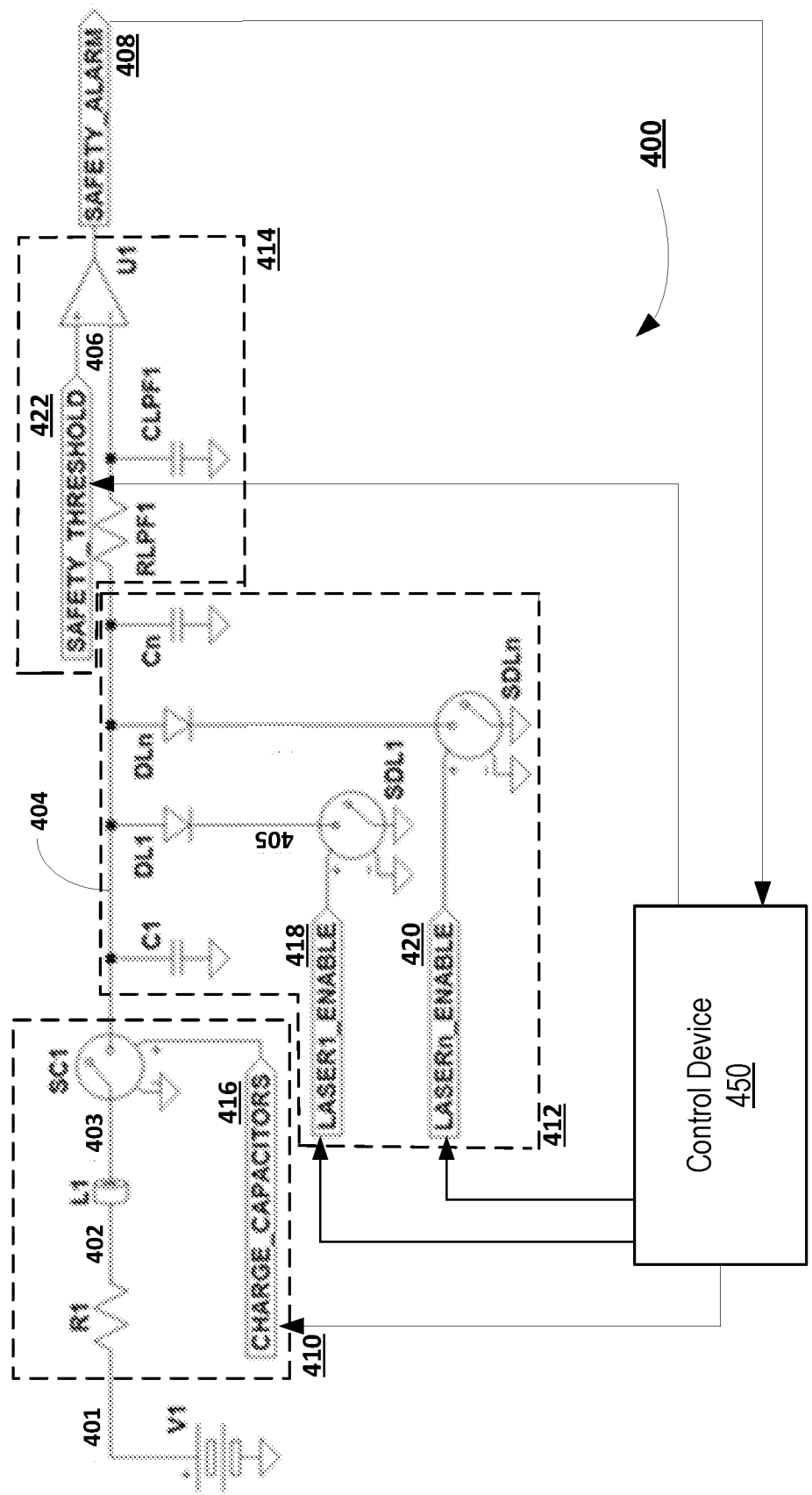
FIG. 4 is a circuit schematic of a transmitter optical sub-assembly (TOSA) according to some embodiments.

FIG. 4 depicts a circuit that implements a transmitter optical sub-assembly (TOSA) 400, according to some embodiments. In the example of FIG. 4, the TOSA 400 has a power supply V1, an energy rate limiter 410, an electro optical modulator 412, and a local energy monitor 414. These components of the TOSA 400 are described in further detail below.

The power supply V1 may have positive and negative voltage terminals. In the example of FIG. 4, the positive terminal of power supply V1 is coupled to a resistor R1 of the energy rate limiter 410.

The energy rate limiter 410 may have a resistor R1, an inductor (e.g., inductive ferrite) L1, and an electrical switch SC1 for limiting the rate of electrical energy transfer from the power supply positive terminal to internal node 403. In some embodiments, the electrical switch SC1 selectively connects internal node 404 to the internal node 403 based on the charging signal 416. Terminals of one or more lasers (e.g., the anodes of one or more laser diodes) of the electro optical modulator 412 may be coupled (e.g., conductively coupled, directly connected, etc.) to the internal node 404. The charging signal 416 may be provided by a control device 450 (e.g., programmable processing device or digital logic circuit) external to the TOSA 400.

The electro optical modulator 412 may include the one or more laser diodes DL1 through DLn, each having an anode terminal and a cathode terminal. Each of the laser diodes may be selectively energized by conducting a current from its anode to its cathode. In the example of FIG. 4, the anodes of laser diodes DL1 through DLn are coupled to internal node 404, which is coupled to internal node 403 via electrical switch SC1. During normal (e.g., fault-free) operation, the switch SC1 may be closed long enough for the voltage measured on internal node 404 to be equivalent to (e.g., substantially equal to) the voltage measured on internal node 403 before switch SC1 is opened to isolate the power supply V1 from the laser circuitry.

The electro optical modulator 412 may also include one or more electrical switches SDL1 through SDLn, for connecting the respective terminals (e.g., cathodes) of the one or more laser diodes of DL1 through DLn to one or more reference terminals (e.g., the negative voltage terminal of the power supply V1). Each of the electrical switches SDL1 through SDLn may be configured (e.g., controlled) by a respective enable signal (e.g., signals 418-420). The laser enable signals may be provided by one or more components external to the TOSA 400 (e.g., a control device 450). Each of the electrical switches SDL1 through SDLn may operate in a manner substantially similar to a "light dimmer," in the sense that each of the switches (SDL1-SDLn) may conduct a variable amount of current based on the corresponding enable signal 418-420. In some embodiments, the amount of current that flows through an electrical switch (SDL1-SDLn) and therefore through the laser diode (DL1-DLn) corresponding to the switch may be controlled by rapidly turning the switch on and off. In some embodiments, the switching speed of each of the electrical switches SDL1 through SDLn may approximate a billionth of a second or faster. In some embodiments, the amount of current that flows through an electrical switch (SDL1-SDLn) and therefore through the laser diode (DL1-DLn) corresponding to the switch may depend, at least in part, on the duty cycle of the enable signal (418-420) that controls the switch. In some embodiments, each of the enable signals may control not only the duration of the time period during which the corresponding electrical switch (SDL) conducts current, but also the resistance of the switch when the switch is conducting current.

A local electrical energy storage mechanism is provided within the electro optical modulator 412. The local electrical energy storage mechanism may include one or more electrical energy storage components (e.g., capacitors, batteries, etc.), C1 through Cn. One terminal of each electrical energy storage component may be connected (e.g., conductively coupled, directly connected, etc.) to the terminals (e.g., anodes) of the one or more lasers DL1-DLn via internal node 404, and the other terminal of each energy storage component may be connected to a reference terminal (e.g., the negative voltage terminal of the power supply V1).

A local energy monitor 414 may include a filter (e.g., a low-pass filter) that provides a filtered measurement of the voltage measured at internal node 404, which is effectively the voltage of internal node 403 in many scenarios. The filter may include a resistor RLPF1 and a capacitor CLPF1. The voltage measured at internal node 404 may be the voltage across the electrical energy storage components (C1-Cn) of the electro optical modulator 412. In the example of FIG. 4, a voltage comparator circuit U1 406 compares the filtered voltage of internal node 404 with a voltage threshold (e.g., safety threshold voltage 422), and provides the result of the comparison as the safety alarm signal 408. The voltage threshold 422 may be provided by a component external to the TOSA 400 (e.g., the control device 450). In the example of FIG. 4, the voltage threshold 422 and the filtered voltage of internal node 404 are supplied, respectively, to the positive and negative terminal of the comparator U1. Thus, in the example of FIG. 4, the polarity of the safety alarm signal 408 may be negative when the filtered voltage of the internal node 404 exceeds the voltage threshold 422.

Still referring to FIG. 4, during expected operation of the laser diodes (DL1 through DLn) the electrical energy dissipation and hence optical energy emission of the laser diodes is controlled by (1) the enable signals 418-420, which control the duration and resistance with which switches SDL1 through SDLn conduct current, and (2) the voltage across the terminals of the laser diodes (e.g., the voltage at the anodes of the laser diodes, which are coupled to internal node 404). The duration of the optical pulse emitted by a laser diode (DL) is determined by the switch contact duration (the duration of the time period during which the corresponding switch SDL conducts current), and the power of the optical pulse is controlled by the magnitude of the current conducted through the laser diode (DL), which is determined by the resistance of the corresponding switch SDL and the anode voltage of the laser diode. During unexpected operation of the laser diodes, one of the switches SDL1 through SDLn or control signals 418-420 may fail. The TOSA 400 provides a mechanism to limit the amount of optical energy emitted by the laser diodes in the event of a single component failure. For example, the control device 450 may de-assert (e.g., disable) the charging signal 416 when the safety alarm signal 408 (and, optionally, one or more other signals) indicates that one or more conditions for safely energizing the local storage capacitors (C1 to Cn) are not met (e.g., when a set of single point failure criteria are met). Likewise, in some embodiments, the control device 450 may de-assert the laser control signals (e.g., signals 418-420) when the safety alarm signal 408 (and, optionally, one or more other signals) indicates that one or more conditions for safely operating the lasers are not met.

In some embodiments, n is equal to 8, so the electro optical modulator 412 has 8 laser diodes (DL1-DLn) and 8 energy storage components (C1-Cn). Such embodiments may provide 8 channels of operation for a LiDAR system. Other embodiments may provide other combinations of laser diodes, energy storage components and channels. Some other embodiments may include 1-64 channels, 16 channels, 32 channels, 64 channels, etc.

To enhance (e.g., maximize) performance, TOSA 400 may have a common feed providing efficient connection between the energy rate limiter 410, electro optical modulator 412, and local energy monitor 414. In some embodiments, internal node 404 provides direct connectivity between these components, including the interfaces to energy storage components C1 through Cn and laser diodes DL1 through DLn. This means that energy rate limiter 410, electro optical modulator 412, and local energy monitor 414 have a common feed, i.e., internal node 404. This common feed extends to internal node 403 when switch SC1 is activated.

Also, in some embodiments, the energy storage components (e.g., capacitors) C1 through Cn are physically positioned sequentially between corresponding laser diodes DL1 through DLn. For shorter pulses, positioning the energy storage components (e.g., capacitors) C1 through Cn in close proximity to the corresponding laser diodes DL1 through DLn, can reduce (e.g., minimize) the impedance and time delay for the current from a given energy storage element (e.g., capacitor) to the corresponding laser diode.

One skilled in the art may recognize that the polarity of the circuit elements of TOSA 400 may be "flipped" with substantially no impact on the functionality. Also, the order of components R1, L1 and SC1 positioned in TOSA 400 has no substantial impact on the functionality of TOSA 400.

An example has been described in which the front end of the TOSA is implemented using a voltage source V1 in series with an energy rate limiter 302. As shown in FIG. 4, the energy rate limiter 410 can be implemented as a circuit having a resistor R1, an inductor L1, and an electrical switch SC1 for limiting the rate (or amount) of electrical energy transfer from a power supply V1 to an internal node 404, which is an input terminal of the electro optical modulator (303, 412). Other implementations of the front end of the TOSA are possible.

Figure 5A:
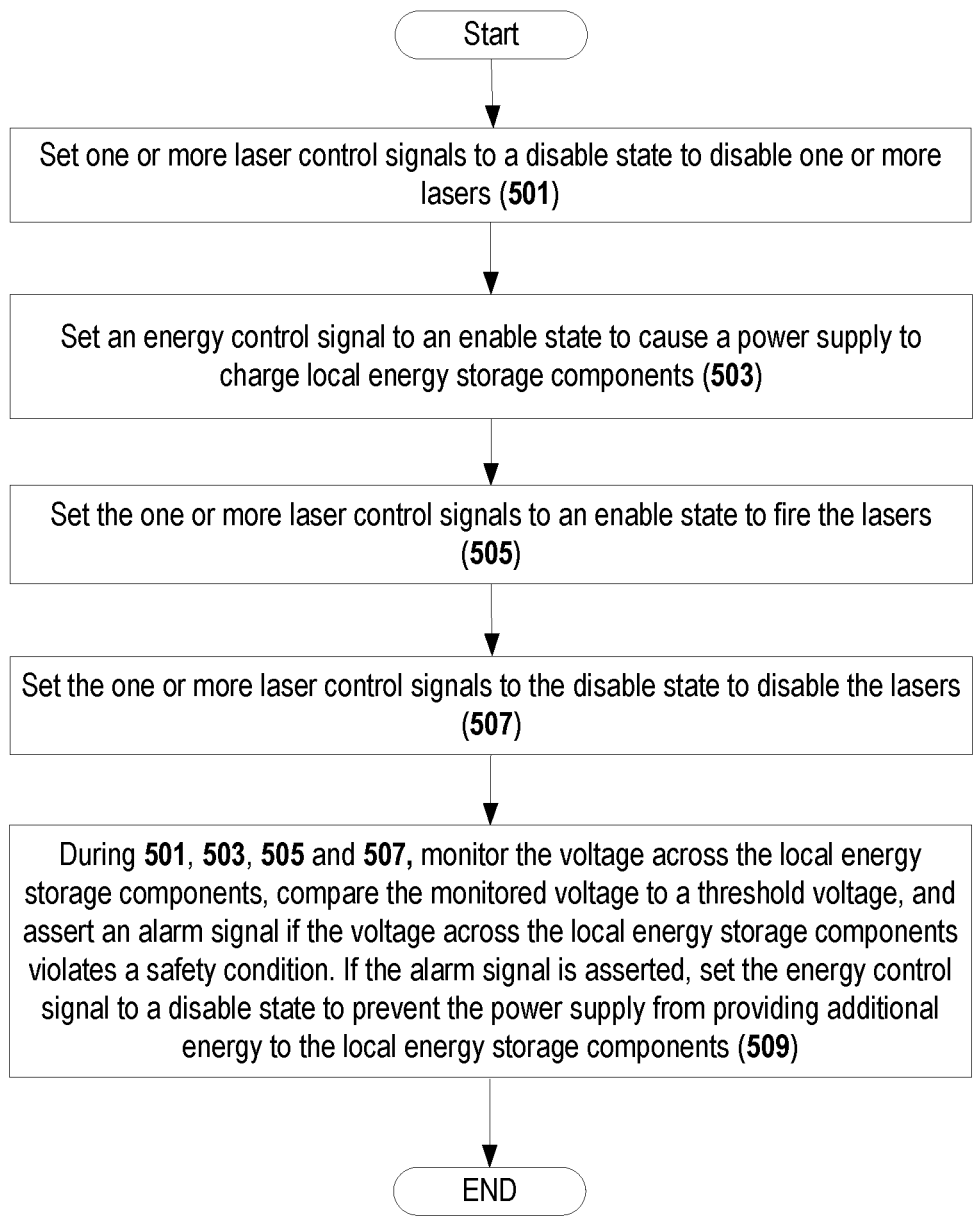
FIG. 5A is a flowchart of a method of providing fault tolerant optical energy limiting according to some embodiments.

FIG. 5A graphically illustrates a method 500A of providing fault tolerant optical energy limiting according to some embodiments of the present disclosure. The method 500A may include process blocks 501-509, some embodiments of which are described below.

In block 501, a controller (e.g., control device 350 or 450) sets the values of one or more laser control signals (e.g., signals 318-320 or 418-420) to a disable state to disable one or more lasers (e.g., lasers of an electro optical modulator 303 or 412). Disabling the lasers may cause the lasers to cease firing and/or prevent the lasers from initiating the firing of new pulses while the lasers remain in the disabled state.

In block 503, a controller (e.g., control device 350 or 450) sets the value of an energy control signal (e.g., 316 or 416) to an enable state (or 'connect' state) to cause a power supply to charge local energy storage components (e.g. local energy storage 305, capacitors C1-Cn, etc.). The energy control signal may remain in the enable state for any suitable duration of time (e.g., for a predetermined time period expected to be sufficient to charge the local energy storage to a particular potential; until the local energy storage reaches a predetermined potential; etc.

In block 505, a controller (e.g., control device 350 or 450) sets the values of one or more of the laser control signals to an enable state to enable current to pass through one or more respective lasers. Passing current through a laser may cause the laser to fire.

In block 507, a controller (e.g., control device 350 or 450) sets the values of the one or more laser control signals to the disable state to disable the respective lasers. Disabling the lasers may cause the lasers to cease firing and/or prevent the lasers from initiating the firing of new pulses while the lasers remain in the disabled state.

In block 509, which may be performed during the operations of blocks 501-507, an energy monitor (e.g., local energy monitor 306 or 414) may monitor the voltage across the local energy storage components (e.g., the voltage at node 304 in TOSA 300 or at node 404 in TOSs 400) and compare the monitored voltage to a threshold voltage (e.g., a threshold voltage represented by the safety threshold signal 322 or 422). The monitoring and/or the comparing may be performed continuously, continually, periodically, intermittently, or in response to control signals. The energy monitor may assert (e.g., enable) an alarm signal (e.g., safety alarm signal 308 or 408) in response to determining that the voltage across the local energy storage components violates a safety condition. For example, the energy monitor may assert the alarm signal when a fault condition is detected. In some embodiments, a fault condition is detected when the voltage across the local energy storage components drops below the threshold voltage, indicating excessive discharge of the local energy storage components. In some embodiments, a fault condition is detected when the voltage across the local energy storage components rises above the threshold voltage, indicating excessive charging of the local energy storage components.

Still referring to block 509, a controller (e.g., control device 350 or 450) may monitor the alarm signal. If at any time the alarm signal is asserted, the controller may set the energy control signal to a disable state (or 'disconnect' state) to prevent additional energy from reaching the local energy storage components from the power supply. In some embodiments, if the alarm signal is asserted, the controller may also set the laser control signals (e.g., signals 318-320 or 418-420) to the disabled state.

Figure 5B:
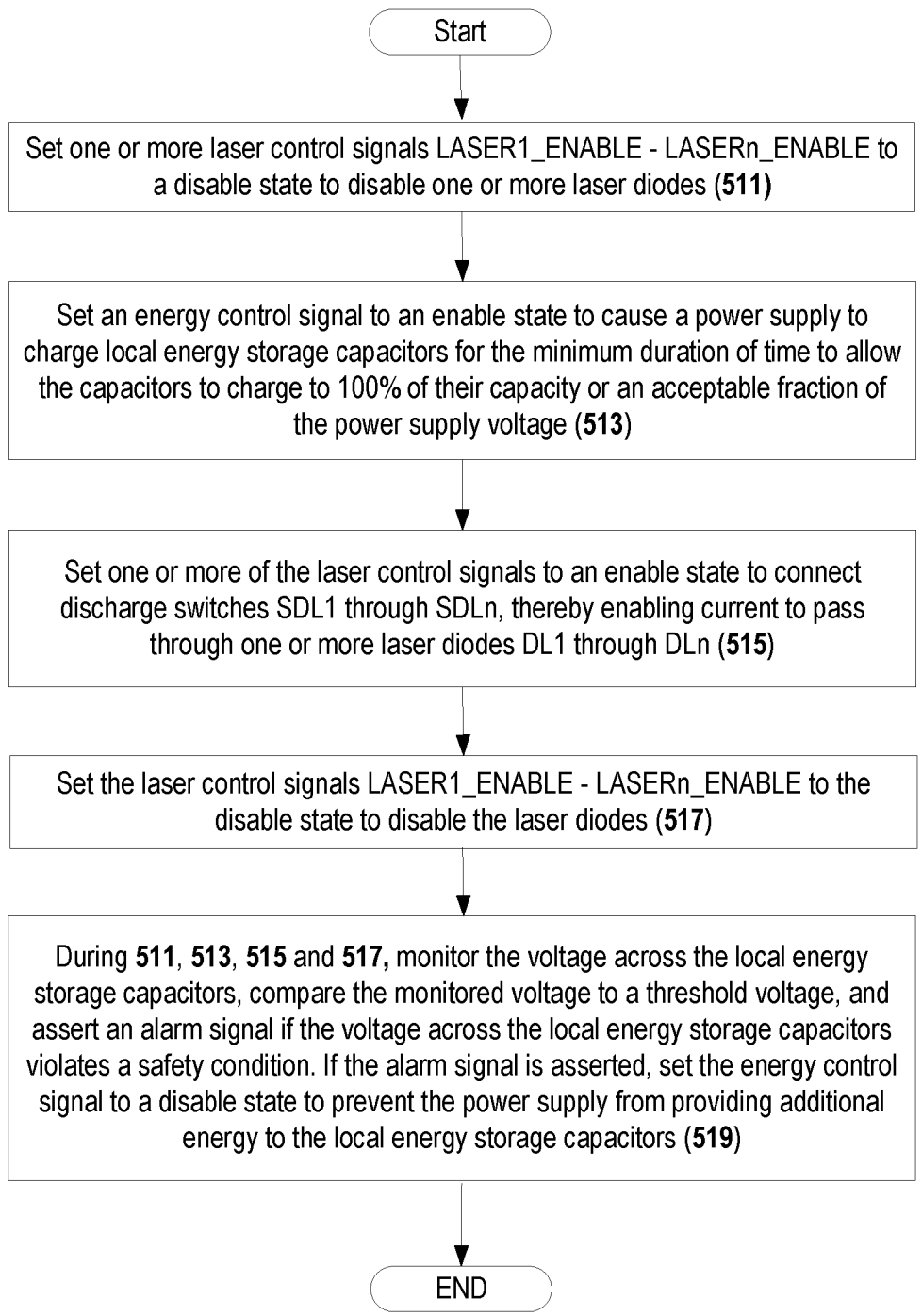
FIG. 5B is a flowchart of another method of providing fault tolerant optical energy limiting according to some embodiments.

FIG. 5B graphically illustrates another method 500B of providing fault tolerant optical energy limiting according to some embodiments of the present disclosure. The method 500B may include process blocks 511-519, some embodiments of which are described below.

In block 511, a controller (e.g., control device 450) sets the values of one or more laser control signals (e.g., signals 318-320 or 418-420) to a disable state to disable one or more laser diodes DL1 through DLn (e.g., by disconnecting discharge switches SDL1 through SDLn).

In block 513, a controller (e.g., control device 450) set the value of an energy control signal (e.g., the charging signal 416) to an enable state (or 'connect' state) to connect a capacitor charging switch SC1 for the minimum duration of time to allow the local energy storage capacitors C1 through Cn to charge to 100% of their capacity or an acceptable fraction of the power supply voltage V1 through an energy transfer rate limiting resistor R1 and inductor (e.g., inductive ferrite). The acceptable fraction of the power supply voltage may be determined based on application laser pulse energy and pulse repetition rate requirements.

In block 515, a controller (e.g., control device 450) sets the values of one or more laser control signals (e.g., signals 318-320 or 418-420) to an enable state to connect discharge switches SDL1 through SDLn, thereby enabling current to pass through one or more laser diodes DL1 through DLn.

In block 517, a controller (e.g., control device 450) sets the values of the one or more laser control signals (e.g., signals 318-320 or 418-420) to the disable state to disable the laser diodes DL1 through DLn (e.g., by disconnecting discharge switches SDL1 through SDLn.

In block 519, which may be performed during the operations of blocks 511-519, an energy monitor (e.g., local energy monitor 414) may monitor the voltage across the capacitors C1 through Cn (e.g., the voltage at node 404 in TOSA 400) and compare the monitored voltage to a threshold voltage (e.g., a threshold voltage represented by the safety threshold signal 422). The monitoring and/or the comparing may be performed continuously, continually, periodically, intermittently, or in response to control signals. The monitoring may be performed by a voltage comparator circuit U1. The energy monitor may assert (e.g., enable) an alarm signal (e.g., safety alarm signal 408) in response to determining that the voltage across the local energy storage components violates a safety condition. For example, the energy monitor may assert the alarm signal when a fault condition is detected. In some embodiments, a fault condition is detected when the voltage across the local energy storage components drops below the threshold voltage, indicating excessive discharge of the local energy storage components (e.g., capacitors C1 through Cn). In some embodiments, a fault condition is detected when the voltage across the local energy storage components rises above the threshold voltage, indicating excessive delivery of power to the local energy storage components.

Still referring to block 519, a controller (e.g., control device 450) may monitor the safety alarm signal. If at any time the safety alarm signal is asserted, the controller may set the energy control signal to a disable state (or 'disconnect') state to prevent additional energy from reaching the local energy storage capacitors C1 through Cn from power supply V1. In some embodiments, if the alarm signal is asserted, the controller may also set the laser control signals (e.g., signals 318-320 or 418-420) to the disabled state.

Use Cases, Benefits, and Applications of Some Embodiments

When the energy rate limiter 302 disconnects the power supply from the electro optical modulator 303 (e.g., when switch SC1 is in open), some embodiments limit the maximum optical energy dissipation of the lasers LD1 through LDn to:

$$E = \tfrac{1}{2}C(Vps^2 - Vt^2) \ast EOeff$$

where C is the sum of capacitance of the local energy storage components (e.g., C1 through Cn), Vps is the voltage of power supply V1, Vt is the laser diode optical threshold voltage, and EOeff is the electro-optical efficiency of the laser diodes.

In some embodiments, the safety methods and devices described herein may be tested by simulating one or more fault conditions in the TOSA (300, 400) (e.g., malfunctions in one or more components of the TOSA), measuring (or estimating) the optical energy dissipation of the lasers, and determining whether the optical energy dissipation of the lasers remains within safe limits during the fault. For example, a fault condition may be simulated by forcing one or more of the lasers to remain enabled irrespective of any alarm signal provided by the local energy monitor (306, 414). A laser may be forced to remain enabled by maintaining the laser's discharge switch in the connected state and/or by maintaining the laser's control signal in the 'enabled' state. The simulation of such a fault condition may be initiated (1) before the local energy storage components of the electro optical modulator (303, 412) begin to charge, (2) while the local energy storage components of the electro optical modulator are charging (e.g., which charging switch SC1 is in the connected state), or (3) during a break in the charging of the local energy storage components of the electro optical modulator (e.g., after the energy storage components have been charged and the charging switch SC1 has been switched to the disconnected state). Some examples of techniques for measuring (or estimating) the optical energy dissipation of the lasers during a fault condition are described above.

In the case that one or more of the discharge switches (SDL1-SDLn) or the laser control signals (e.g., signals 318-320 or 418-420) fail(s) while the power supply is connected to the electro optical modulator 303 through the energy rate limiter 302 (e.g., while the charging switch SC1 is closed), some embodiments limit the maximum optical energy dissipation of the lasers LD1 through LDn to approximately:

$$E = \tfrac{1}{2}C(Vps^2 - Vt^2) \ast EOeff + (Isc1 \ast Tsc1 \ast Ediff)$$

where C is the total capacitance of the local energy storage 305 (e.g., the sum of capacitances C1 through Cn), Vps is the voltage of power supply V1, Vt is the laser diode optical threshold voltage, EOeff is the electro-optical efficiency of the laser diodes, Isc1 is the average current provided to the electro optical modulator 303 via the energy rate limiter 302 (e.g., through the charging switch SC1) during time Tsc1 when SC1 remains in the connected state after the discharge switch(es) (SDL1-SDLn) or lasers control signals (e.g., signals 318-320 or 418-420) have failed, and Ediff is the laser optical watts per ampere differential efficiency.

By disconnecting the power supply V1 from the electro optical modulator 303, the safety alarm 414 may reduce (e.g., minimize) the additional fault energy due to the Isc1 and Tsc1 product. In some embodiments, the energy rate limiting components of the energy rate limiter (e.g., the resistor R1 and inductor L1) control (e.g., limit) the magnitude of additional fault current Isc1, and the response time of the safety alarm 414 controls the duration of the additional fault current.

In some embodiments, one or more components (e.g., circuits) external to the TOSA (300, 400) assure that the voltage of the power supply V1 and the safety threshold voltage are set within suitable limits. In some embodiments, after the TOSA (300, 400) is powered on, the controller (e.g., control device 350 or 450) may permit the energy rate limiter (302, 410) to initiate charging of the local energy storage components of the electro optical modulator (303, 412) only if the voltage of the power supply V1 and the safety threshold voltage provided to the local energy monitor (306, 414) are set to suitable values.

In summary, an apparatus for controlling (e.g., maximizing) optical energy emission during expected operating conditions while simultaneously limiting optical energy emission during unexpected operating conditions may include: an energy rate limiter operable to limit a rate of an energy transfer, based on an energy control signal, from a power supply to one or more local energy storage components; the local energy storage components operable to be charged based on the energy transfer from the energy rate limiter; and an electro optical modulator including one or more lasers coupled to the local energy storage components. The laser firings of the one or more lasers may be based on a voltage provided by the local energy storage components and one or more corresponding laser enable signals. The apparatus may also include a local energy monitor coupled to the local energy storage components. The local energy monitor may be operable to trigger a safety alarm if a safety condition is violated based on the voltage provided by the local energy storage components. When the safety condition is violated, subsequent firings of the one or more lasers are limited. In particular, If the safety condition is violated, the energy control signal is disabled causing termination of the energy transfer from the power supply to the local energy storage components. With the termination of the energy transfer from the power supply to the local energy storage components, the energy for subsequent laser firings is limited by an existing potential of the local energy storage components, which may be determined based on the capacitance of the local energy storage components and the voltage across those components.

In some embodiments, the energy rate limiter includes a resistor, an inductor (e.g., inductive ferrite), and a switch controlled by the energy control signal. The switch may be enabled for a duration of time sufficient to allow the local energy storage components to charge (e.g., to a specific potential or to full capacity) through the resistor and the inductor. The local energy storage components may include one or more (N) capacitors and the electro optical modulator may include one or more (N) laser diodes. The N capacitors may be physically positioned sequentially between corresponding lasers diodes. An output of the energy rate limiter, one terminal of the N capacitors, one terminal of the N laser diodes and an input to the local energy monitor may share (e.g., be coupled or connected to) a common internal node. The electro optical modulator may further include one or more corresponding laser discharge switches that control firing of the one or more lasers based on the one or more laser enable signals. The local energy monitor may compare a low pass filtered measurement of a voltage of the local energy storage components with the safety threshold.

System Embodiments

In embodiments, aspects of the techniques described herein may be directed to or implemented on information handling systems/computing systems. For purposes of this disclosure, a computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data for business, scientific, control, or other purposes. For example, a computing system may be a personal computer (e.g., laptop), tablet computer, phablet, personal digital assistant (PDA), smart phone, smart watch, smart package, server (e.g., blade server or rack server), a network storage device, or any other suitable device and may vary in size, shape, performance, functionality, and price. The computing system may include random access memory (RAM), one or more processing resources such as a central processing unit (CPU) or hardware or software control logic, ROM, and/or other types of memory. Additional components of the computing system may include one or more disk drives, one or more network ports for communicating with external devices as well as various input and output (I/O) devices, such as a keyboard, a mouse, touchscreen and/or a video display. The computing system may also include one or more buses operable to transmit communications between the various hardware components.

Figure 6:
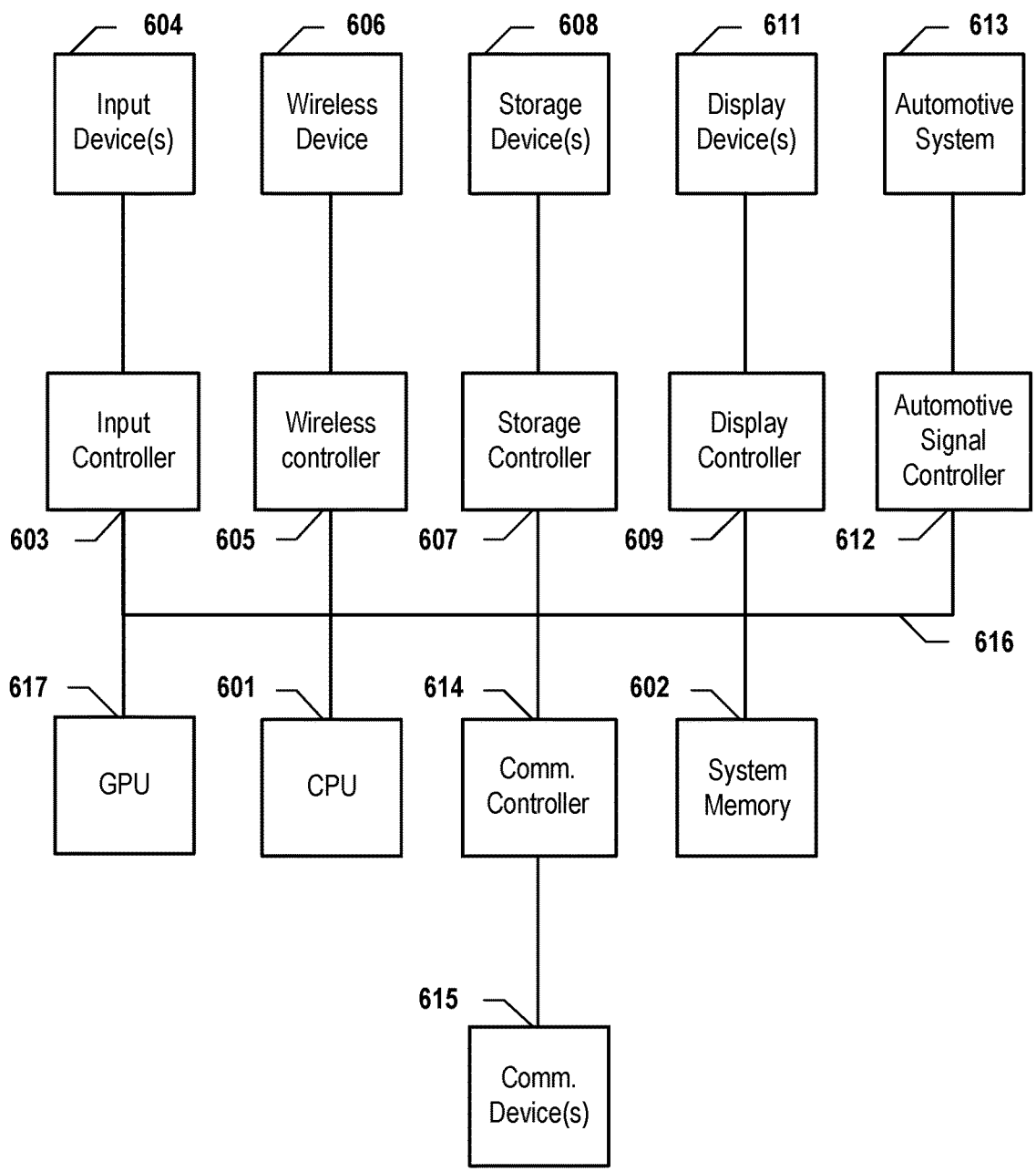
FIG. 6 is a block diagram of a computing device/information handling system, in accordance with some embodiments.

FIG. 6 depicts a simplified block diagram of a computing device/information handling system (or computing system) according to embodiments of the present disclosure. It will be understood that the functionalities shown for system 600 may operate to support various embodiments of an information handling system—although it shall be understood that an information handling system may be differently configured and include different components.

As illustrated in FIG. 6, system 600 includes one or more central processing units (CPU) 601 that provides computing resources and controls the computer. CPU 601 may be implemented with a microprocessor or the like, and may also include one or more graphics processing units (GPU) 617 and/or a floating point coprocessor for mathematical computations. System 600 may also include a system memory 602, which may be in the form of random-access memory (RAM), read-only memory (ROM), or both.

A number of controllers and peripheral devices may also be provided, as shown in FIG. 6. An input controller 603 represents an interface to various input device(s) 604, such as a keyboard, mouse, or stylus. There may also be a scanner controller 605, which communicates with a scanner 606. System 600 may also include a storage controller 607 for interfacing with one or more storage devices 608 each of which includes a storage medium such as magnetic tape or disk, or an optical medium that might be used to record programs of instructions for operating systems, utilities, and applications, which may include embodiments of programs that implement various aspects of the techniques described herein. Storage device(s) 608 may also be used to store processed data or data to be processed in accordance with some embodiments. System 600 may also include a display controller 609 for providing an interface to a display device 611, which may be a cathode ray tube (CRT), a thin film transistor (TFT) display, or other type of display. The computing system 600 may also include an automotive signal controller 612 for communicating with an automotive system 613. A communications controller 614 may interface with one or more communication devices 615, which enables system 600 to connect to remote devices through any of a variety of networks including the Internet, a cloud resource (e.g., an Ethernet cloud, an Fiber Channel over Ethernet (FCoE)/Data Center Bridging (DCB) cloud, etc.), a local area network (LAN), a wide area network (WAN), a storage area network (SAN) or through any suitable electromagnetic carrier signals including infrared signals.

In the illustrated system, all major system components may connect to a bus 616, which may represent more than one physical bus. However, various system components may or may not be in physical proximity to one another. For example, input data and/or output data may be remotely transmitted from one physical location to another. In addition, programs that implement various aspects of some embodiments may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Some embodiments may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that some embodiments may further relate to computer products with a non-transitory, tangible computer-readable medium that have computer code thereon for performing various computer-implemented operations. The media and computer code may be those specially designed and constructed for the purposes of the techniques described herein, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Some embodiments may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the techniques described herein. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. An apparatus comprising:
   an energy rate limiter operable to limit energy transfer, based on an energy control signal, from a power supply to a local energy storage module;
   the local energy storage module operable to be charged based on the energy transfer from the power supply;
   an electro optical transmitter comprising one or more lasers coupled to the local energy storage module, wherein laser firings of the one or more lasers are based on an electrical potential of the local energy storage module and one or more laser enable signals corresponding to the one or more lasers; and
   a local energy monitor coupled to the local energy storage module and operable to trigger a safety alarm signal if a voltage provided by the local energy storage module violates a safety condition related to a safety threshold voltage,
   wherein, the energy rate limiter is operable to terminate the energy transfer from the power supply to the local energy storage module after the safety condition is violated.

2. The apparatus of claim 1, wherein the energy rate limiter is operable to terminate the energy transfer from the power supply to the local energy storage module based on the energy control signal being in a disabled state, and wherein the energy control signal is placed in the disabled state in response to the safety condition being violated.

3. The apparatus of claim 2, wherein after the energy rate limiter terminates the energy transfer from the power supply to the local energy storage module, an amount of energy available for subsequent laser firings is limited to an amount of electrical energy stored in the local energy storage module prior to termination of the energy transfer.

4. The apparatus of claim 1, wherein, the energy rate limiter comprises a resistor, an inductor, and a switch controlled by the energy control signal.

5. The apparatus of claim 4, wherein the energy control signal is configured to enable the switch for a duration of time sufficient to allow the local energy storage module to charge through the resistor and the inductor to a predetermined electrical potential.

6. The apparatus of claim 1, wherein the local energy storage module comprises N capacitors (N>1) and the electro optical modulator comprises N laser diodes.

7. The apparatus of claim 6, wherein the N capacitors are physically positioned sequentially between adjacent lasers diodes.

8. The apparatus of claim 6, wherein an output terminal of the energy rate limiter, a respective terminal of each of the N capacitors, a respective terminal of each of the N laser diodes and an input terminal of the local energy monitor are connected to a common internal node.

9. The apparatus of claim 1, wherein the electro optical modulator further comprises one or more corresponding laser discharge switches that control the laser firing of the one or more lasers based on the one or more laser enable signals.

10. The apparatus of claim 1, wherein the local energy monitor is operable to:
    compare a low pass filtered measurement of a voltage provided by the local energy storage module to the safety threshold voltage; and
    trigger the safety alarm signal based on a result of the comparison.

11. The apparatus of claim 1, further comprising a control device operable to provide the energy control signal based, at least in part, on the safety alarm signal.

12. The apparatus of claim 11, wherein the control device is further operable to provide a signal indicating the safety threshold voltage to the local energy monitor.

13. The apparatus of claim 1, further comprising generating the energy control signal based, at least in part, on the safety alarm signal.

14. The apparatus of claim 1, wherein the safety condition is violated when (i) the energy control signal has a voltage less than a first threshold value, indicating excessive discharge of the local energy storage module, or (ii) the energy control signal has a voltage greater than a second threshold value, indicating excessive charging of the local energy storage module.

15. A method comprising:
controlling energy transfer, based on an energy control signal, from a power supply to an energy storage module;
firing one or more lasers based on an electrical potential of the energy storage module and one or more laser enable signals corresponding to the one or more lasers;
monitoring a voltage provided by the energy storage module and triggering a safety alarm signal when the voltage provided by the energy storage module violates a safety condition related to a safety threshold voltage; and
terminating the energy transfer from the power supply to the local energy storage module after the safety alarm signal is triggered.

16. The method of claim 15, further comprising terminating the energy transfer from the power supply to the local energy storage module based on the energy control signal being in a disabled state, wherein the energy control signal is placed in the disabled state in response to the safety condition being violated.

17. The method of claim 16, wherein after terminating the energy transfer from the power supply to the energy storage module, an amount of energy emitted in subsequent laser firings is limited to an amount of electrical energy stored in the energy storage module prior to termination of the energy transfer.

18. The method of claim 15, further comprising comparing a measurement of a voltage provided by the local energy storage module to the safety threshold voltage, wherein the safety alarm signal is triggered based on a result of the comparison.

19. The method of claim 15, wherein the safety condition is violated when (i) the energy control signal has a voltage less than a first threshold value, indicating excessive discharge of the local energy storage module, or (ii) the energy control signal has a voltage greater than a second threshold value, indicating excessive charging of the local energy storage module.

20. A method comprising:
(a) setting one or more laser control signals to a disable state to disable firing of one or more lasers;
(b) setting an energy control signal to an enable state to connect a power supply to a local energy storage module for a duration of time;
(c) setting the one or more laser control signals to an enable state to enable firing of the one or more lasers;
(d) setting again the one or more laser control signals to the disable state to again disable firing of the one or more lasers; and
(e) during operations (a)-(d), monitoring a safety alarm signal provided by a local energy monitor and setting the energy control signal to a disable state to disconnect the power supply from the local energy storage module when the safety alarm signal is asserted.

21. The method of claim 20, wherein the one or more laser control signals are provided to control terminals of one or more respective laser control switches.

22. The method of claim 21, wherein each of the laser control switches is operable to control an amount of current conducted through the respective laser corresponding to the laser control switch based on one or more properties of the laser control signal provided to the laser control switch.

23. The method of claim 20, wherein the energy control signal is provided to a control terminal of an energy control switch.

24. The method of claim 20, wherein the safety alarm signal is asserted when a safety condition is violated, and wherein the safety condition is violated when a voltage provided by the local energy storage module is less than a first threshold value, indicating excessive discharge of the local energy storage module, or the voltage provided by the local energy storage module is greater than a second threshold value, indicating excessive charging of the local energy storage module.

25. A control device comprising:
one or more processing devices; and
one or more computer-readable storage devices storing instructions that, when executed by the processing device(s), cause the processing device(s) to perform operations including:
(a) setting one or more laser control signals to a disable state to disable firing of one or more lasers;
(b) setting an energy control signal to an enable state to connect a power supply to a local energy storage module for a duration of time;
(c) setting the one or more laser control signals to an enable state to enable firing of the one or more lasers;
(d) setting again the one or more laser control signals to the disable state to again disable firing of the one or more lasers; and
(e) during operations (a)-(d), monitoring a safety alarm signal provided by a local energy monitor and setting the energy control signal to a disable state to disconnect the power supply from the local energy storage module when the safety alarm signal is asserted.

26. The control device of claim 25, wherein the one or more laser control signals are provided to control terminals of one or more respective laser control switches.

27. The control device of claim 26, wherein each of the laser control switches is operable to control an amount of current conducted through the respective laser corresponding to the laser control switch based on one or more properties of the laser control signal provided to the laser control switch.

28. The control device of claim 25, wherein the energy control signal is provided to a control terminal of an energy control switch.

29. The control device of claim 25, wherein the safety alarm signal is asserted when a safety condition is violated, and wherein the safety condition is violated when a voltage provided by the local energy storage module is less than a first threshold value, indicating excessive discharge of the local energy storage module, or the voltage provided by the local energy storage module is greater than a second threshold value, indicating excessive charging of the local energy storage module.

* * * * *